METHOD OF USING A MASTER ART DRAWING TO PRODUCE
A TWO-SIDED PRINTED CIRCUIT BOARD

Filed May 31, 1962 2 Sheets-Sheet 1

INVENTOR
Fred W. Houtz, Jr.,

BY R. P. Miller

ATTORNEY

INVENTOR
Fred W. Houtz, Jr.,
BY R. P. Miller
ATTORNEY

United States Patent Office 3,264,105

Patented August 2, 1966

3,264,105

METHOD OF USING A MASTER ART DRAWING TO PRODUCE A TWO-SIDED PRINTED CIRCUIT BOARD

Fred W. Houtz, Jr., Greensboro, N.C., assignor to Western Electric Company, Incorporated, New York, N.Y., a corporation of New York Filed May 31, 1962, Ser. No. 199,575
5 Claims. (Cl. 96—36.2)

This invention relates to a method of using a master art drawing to produce a two-sided printed circuit board and more particularly to a method for producing different circuit patterns on opposite sides of a printed circuit board from a single master art drawing.

A prior art method for the fabrication of two-sided printed circuit boards is to construct a separate master art drawing for each side of the circuit board. Each master art drawing consists of a sheet of one color having a circuit pattern laid out on the surface in colored tapes of a second or contrasting color. The circuit patterns on the two sheets are then separately photographed and reproduced on the respective sides of the circuit board. A prevalent problem exists in aligning the circuit pattern which is common to both sides. Alignment is often left to the haphazard guess of the human eye.

An object of this invention is to provide a new and improved method of producing patterns representative of circuits on opposite sides of a printed circuit board from a single master art drawing.

Another object is to provide a method of constructing on a single master art drawing, patterns representative of two different circuit paths, and selectively reproducing from the master drawing the patterns on different metallic surfaces.

Another object is to provide a method of reproducing circuit patterns on the two sides of a printed circuit board from a single master art drawing wherein circuit paths common to both sides of the circuit board are accurately aligned.

An additional object is to provide a method for master art drawing construction wherein patterns representative of different circuit paths for the two sides of a circuit board are arranged in different colors on a single master art drawing which is photographed successively through appropriate filters to preclude certain of the colored patterns to produce negatives representative of the circuit paths for the two sides of the circuit board.

A further object is to provide a method of reproducing circuit patterns on opposite sides of a printed circuit board from photographic negatives wherein the aligning of a circuit pattern common to both sides of the circuit board is accomplished by aligning pins and associated locating holes in the negatives.

A still further object is to provide a method of constructing patterns representative of different circuit paths for the two sides of a printed circuit board on a single master art drawing in different colors and in overlapping relation in certain areas wherein the master art board is successively photographed through appropriate filters to preclude certain of the colored circuit paths to produce negatives representative of the circuit patterns, including the overlapped areas, for each side of the board.

With these and other objects in mind and in accordance with the contemplated invention, two patterns representative of two different circuit paths are applied to a master art drawing. Each pattern consists of a translucent tape in a separate and distinct color. The color patterns have sections that overlap. A photograph is taken through a first color filter to produce a first negative depicting a circuit path represented by a first color pattern and the overlapping sections. A photograph is taken through a second color filter to produce a second negative depicting the circuit path represented by the second color pattern and the overlapping sections. The two negatives are used to sequentially or simultaneously print on opposite sides of a printed circuit board having photosensitive surfaces. Registration of the circuit patterns is accomplished by aligning punched unexposed film on locating pins mounted in a camera.

Other objects and advantages of the invention will become apparent by reference to the following detailed specification and drawings, wherein.

GENERAL ARRANGEMENTS

Figure 1:
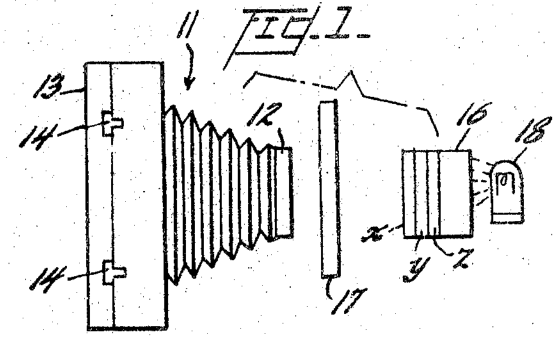
FIG. 1 is a side view of an arrangement of equipment that may be used to practice the method of reproducing patterns respective of circuit paths on a two-sided print circuit board from a single master art board, utilizing the principles of the invention.

Referring to FIG. 1, there is shown apparatus for reproducing the patterns representative of circuit paths of a two-sided printed circuit board. A copy camera 11 has a lens 12 and a film holder 13 with locating pins 14. Positioned in front of the lens 12 is a master art drawing 16 (hereinafter called a master) having three circuit patterns X, Y, and Z arranged thereon in three different colors. These patterns may be formed of translucent or transparent colors plastic tapes having pressure sensitive adhesive on one side. The tapes may be acetate or polyethylene terephthalate, commercially available as Mylar, a trademark of Dupont. The master 16 may be constructed of a transparent or translucent paper, or plastic, such as a polyester film. Interposed between the lens 12 and the master 16 is a photographic color selective filter 17 which precludes the light transmitted by two of the colored tapes. The filter 17 may be a commercially available glass or gelatin coated acetate selective color filter commonly used for color separation. Located to the right of the master 16 is a light source 18. The filter 17, master 16, and light source 18 are in register with the camera lens 12.

Figure 2:
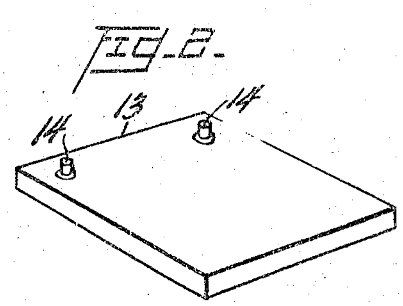
FIG. 2 is a perspective view representative of a film holder having aligning pins for a camera.

With reference to FIG. 2, there is shown in greater detail, the film holder 13 having pins 14 thereon. Locating holes are formed in two sheets of unexposed film (not shown). The unexposed film is placed onto pins 14, thereby registering the film with respect to master 16. Without moving the master 16, films located on the pins 14 and exposed separately, register with respect to each other when subsequently pinned together with the locating holes.

Figure 3:
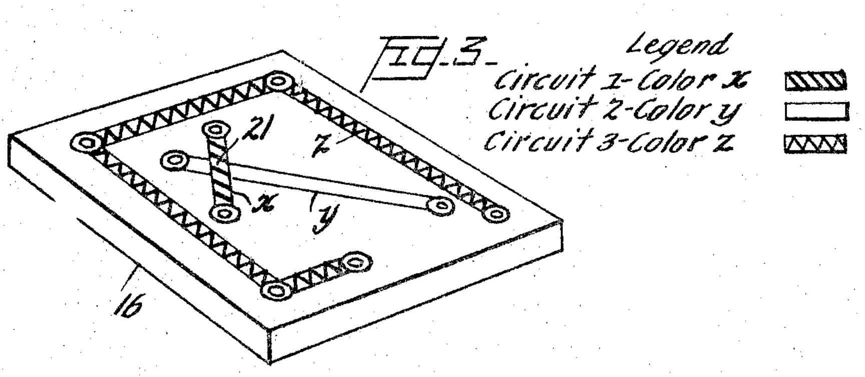
FIG. 3 is a perspective view of a master art drawing having three different colored patterns arranged on one surface.

Referring to FIG. 3, there is shown the transparent master 16 on which is arranged three distinct circuit patterns X, Y, and Z representative of circuit paths to be printed on opposite sides of a laminated printed circuit board 41 (FIG. 5, hereafter called circuit board) having conductive layers 43 of copper on opposite sides. Circuit pattern X consists of a transparent or translucent blue tape, circuit pattern Y consists of a transparent or translucent yellow tape, and circuit pattern Z consists of a transparent or translucent green tape. Blue circuit pattern X and yellow circuit pattern Y intersect and overlap one another at crossover point 21.

With the arrangement of apparatus as shown in FIG. 1, light rays from the light source 18 pass through the transparent master 16, the colored tape patterns X, Y, and Z, and impinge upon the filter 17.

When a filter 17 is used which precludes the blue and green wavelengths of light, then wavelengths of light representative of the yellow pattern Y pass through the filter to impinge upon the lens 12. The wavelengths of light indicative of the blue pattern X and the green pattern Z are blocked from passing through the filter 17. Also, when a filter 17 is used which precludes the yellow and green wavelengths of light, then wavelengths of light representative of the blue pattern X pass through the filter to impinge upon the lens 12. The wavelengths of light indicative of the yellow pattern Y and green pattern Z are blocked from passing through the filter 17. For either filter used, wavelengths of light indicative of the green pattern Z are blocked from passing through the filter 17, and light rays passing through the remaining areas of the transparent master pass through the filter 17 to the lens 12.

At the intersection 21 of the blue circuit pattern X and the yellow circuit pattern Y, light passing through the overlapping patterns is precluded from impinging upon the lens 12 when either filter 17 is used. When the filter 17 which precludes blue and green light is used, light passing through the intersection 21 must pass through the blue tape and therefore be precluded by the filter. Similarly, when the filter 17 which precludes yellow and green light is used, light passing through the intersection 21 must pass through the yellow tape and therefore be precluded by the filter.

Likewise, if a black tape is used for the pattern Z, no light rays pass through the black pattern; hence, an absence of light representative of pattern Z is presented to the filter 17.

FIRST EMBODIMENT

Figure 4:
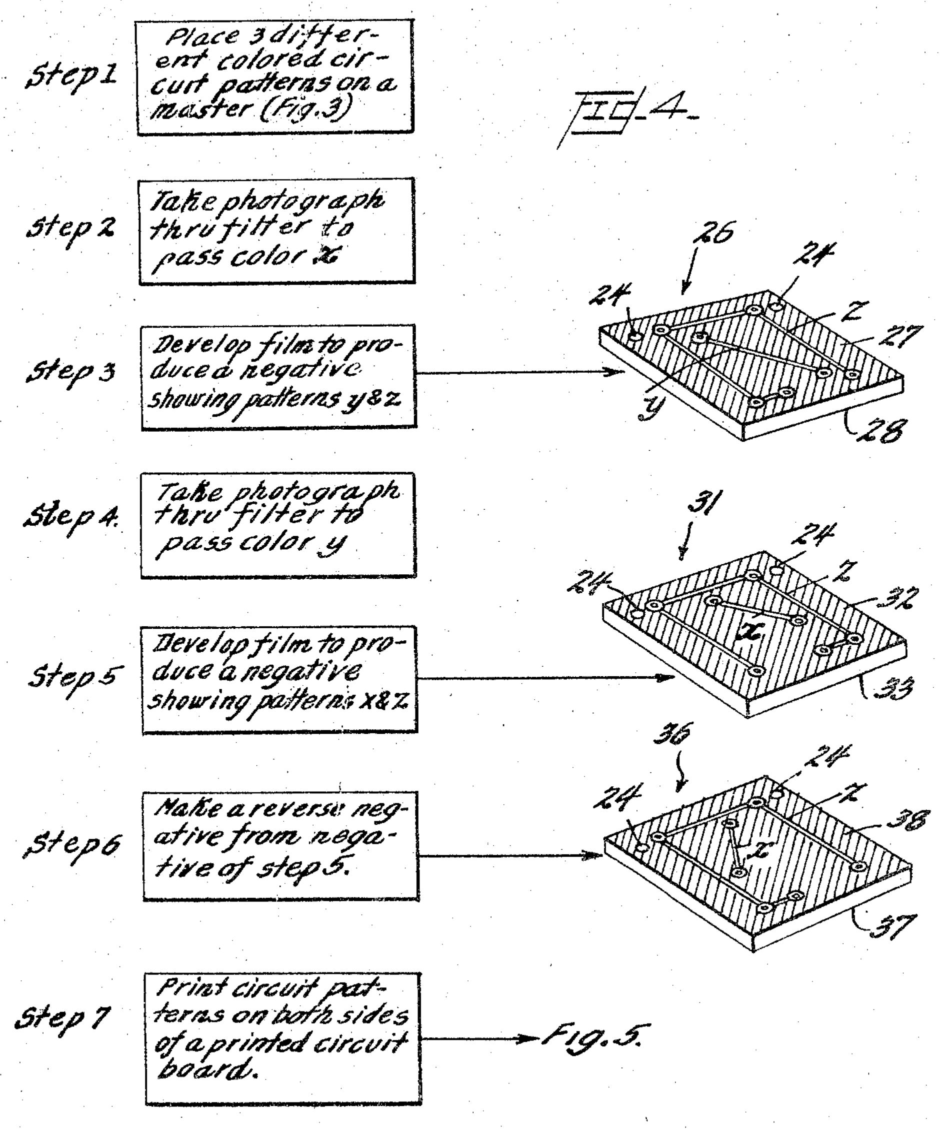
FIG. 4 is a series of block diagrams showing the steps of practicing the method of the invention.

Referring to FIG. 4, there is shown in block outline form the steps of constructing a master art drawing and reproducing patterns representative of circuit paths for the opposite sides of a two-sided printed circuit board onto the circuit board. The arrangement of apparatus of FIG. 1 is used in this embodiment. The method comprises the following steps:

*Step 1.*—Place 3 different colored patterns on a master (FIG. 3). A pattern Z which is representative of a circuit common to both sides of a circuit board, i.e., finger contact, etc., is constructed with a translucent green tape on the transparent master 16. A pattern X representative of another circuit for one side of the circuit board is constructed with a translucent blue tape. A pattern Y representative of another circuit for the other side of the circuit board is constructed with a translucent yellow tape. The blue tape and the yellow tape cross over in this particular embodiment.

*Step 2.*—Expose a photosensitive photographic film to light passing through the master 16; the translucent yellow, blue, and green circuit patterns; and a color filter 17 which absorbs the yellow and green light. A sheet of unexposed black and white film having locating holes punched therein is mounted onto the pins 14 of the film holder 13. The film is exposed to light passing through the master 16; the patterns X, Y, and Z; and the color filter 17 which precludes the yellow and green light. The light rays passing through the filter 17 and impinging upon the lens 12 outline an image representative of the yellow circuit pattern Y and the green circuit pattern Z.

*Step 3.*—Develop the film to produce a negative showing patterns Y and Z. The film is developed with a commercially available high contrast film developer and acid fixer. The development of the film produces a negative 26, having white lines on a black background representative of yellow circuit pattern Y and green circuit pattern Z, since the light rays emanating from the blue pattern X were allowed to pass through the filter 17. The negative 26 has an image or emulsion side 28 and a film base 27 of polystyrene, celluloid, polyester, or other stable plastic material. This negative 26, having locating holes 24, represents the circuit patterns for one side of the circuit board; that is, the green circuit pattern Z common to both sides and the yellow circuit pattern Y.

*Step 4.*—Expose a photosensitive photographic film to light passing through the master 16; the translucent blue, yellow, and green circuit patterns; and a color filter 17 which absorbs blue and green light. A second sheet of unexposed black and white film having locating holes punched therein is mounted onto the pins 14 of the film holder 13. Without moving the camera 11 or the master 16, the second film is exposed to light passing through the master 16, the patterns X, Y, and Z, and the color filter 17 which precludes blue and green light. The light rays passing through the filter 17 and impinging upon the lens 12 outline an image representative of the blue circuit pattern X and the green circuit pattern Z.

*Step 5.*—Develop the film to produce a negative showing patterns X and Z. The development of the film produces a negative 31 having white lines on a black background representative of the blue circuit pattern X and green circuit pattern Z, since light rays emanating from the yellow pattern Y were allowed to pass through the filter 17. The negative 31 has an image or emulsion side 32 and a film base 33. This negative 31, having locating holes 24, represents the circuit patterns for the other side of the circuit board; that is, the green circuit pattern Z common to both sides and the blue circuit pattern X.

*Step 6.*—Make a reverse negative from the negative of Step 5. One of the negatives 26 or 31 is in reverse (a mirror image) with respect to the other negative when placed emulsion to emulsion side. Negative 31 is corrected in order to perfectly align the pattern Z on both sides of the circuit board 41. This is accomplished (a) by making a print 36 on an Auto-positive type film with the negative emulsion 32 contacting the Auto-positive type film emulsion 38, or (b) by making a positive on a first Ortho-type film with the photograph emulsion 32 away from the first film emulsion (not shown) and then making a print 36 from a second Ortho-type film with the first positive emulsion contacting the second film emulsion 38. The reverse negative 36 has an image or emulsion side 38, and a celluloid backing side 37. To maintain registration, locating holes 24 are punched in the unexposed film. The negative is pinned to the film when the exposure is made.

Figure 5:
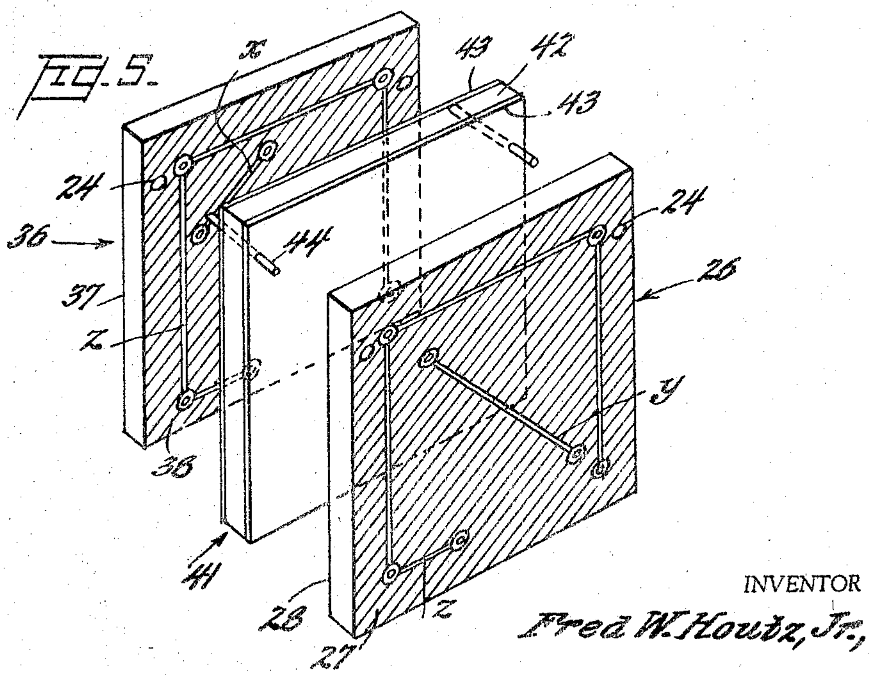
FIG. 5 is a perspective view of Step 7 of FIG. 4 illustrating the manner in which the circuit pattern negatives are aligned prior to printing on the opposite sides of the circuit board.

*Step 7.*—Print the circuit patterns on both sides of a printed circuit board. Referring to FIG. 5, there is shown a printed circuit board 41 having a base 42 of insulation material, i.e., phenol, Bakelite, plastic, or some other suitable material, with a layer of conducting material 43, i.e., copper or other, applied to each side of the base. The circuit board 41 has holes (not shown) extending through the circuit board in positions corresponding to the pins 14 of the film holder 13 and to the locating holes 24 which were punched in the film. The copper layers 43 are coated with a photosensitive emulsion (not shown). Aligning pins 44 are inserted through the holes in the circuit board 41.

The negative 26 is mounted on the aligning pins 44 with the emulsion side 28 placed against a photosensitive surface of the circuit board 41. The negative 36 is mounted on the aligning pins 44 with the emulsion side 38 placed against the other photosensitive surface of the circuit board 41. It is apparent from FIG. 5, that the common circuit pattern Z is precisely alined. The negatives 26 and 36 are brought into optical contact with the photosensitive surfaces of the circuit board 41 with a vacuum frame or other suitable apparatus. Light rays are projected through the negatives 26 and 36 to polymerize or harden portions of the photosensitive surfaces representative of the circuit patterns. The photosensitive surfaces may be a gelatinous emulsion coating which hardens in the areas exposed to the light rays.

It is necessary in this embodiment to use a photo reversal step in order to place the emulsion side of each negative against the photosensitive surface of the circuit board so that the common circuit pattern Z will be accurately aligned on both sides of the board 41. By placing the emulsion side of the negatives against the circuit board, a sharp definition of circuit pattern lines is realized without fuzzy edges.

The following is illustrative of further steps of bringing a circuit board 41 to completion. The negatives 26 and 36 and pins 44 are removed from the circuit board 41. The circuit board 41 is placed in a solvent medium which dissolves or loosens the unexposed portions of the gelatinous photosensitive surfaces leaving a hardened gelatin pattern representative of circuit paths on top of the copper layers of the circuit board. The solvent medium may be trichlorethylene or toluene. The circuit board 41 is washed in water to remove the loosened portions of the photosensitive surfaces.

The circuit board 41 is placed in an etchant medium which attacks the exposed copper and removes this copper down to the insulation base 42. This medium does not attack the copper covered by the hardened gelatinous pattern. Suitable etchants may be ferric chloride or ammonium persulfate.

The circuit board is then placed in another solvent medium which attacks and removes the hardened gelatin on top of the copper circuit paths but does not attack and remove the copper itself. The solvent medium may be isopropyl alcohol and methylene chloride.

Thus, the final product is a two-sided printed circuit board having a circuit which is common and precisely aligned on both sides of the board and each side of the circuit board having other individual circuit paths.

ALTERNATIVE EMBODIMENT

A modified method of practicing the invention is to repeat the first 5 steps of the first embodiment with a new Step 6 added. The method is as follows:

*Step 1.*—Place 3 different colored patterns on a master (FIG. 3). A pattern Z which is representative of a circuit pattern common to both sides of a circuit board is constructed with a translucent green tape. Two other circuit patterns X and Y are constructed on the master using a translucent blue tape and a translucent yellow tape, respectively.

*Step 2.*—Expose a photosensitive photographic film to light passing through the master 16; the translucent yellow circuit pattern Y, the translucent blue circuit pattern X, the translucent green circuit pattern Z, and a color filter 17 which absorbs yellow and green light. The light rays impinging upon the lens 12 outline an image representative of the yellow circuit pattern Y and the green circuit pattern Z.

*Step 3.*—Develop the film to produce a negative showing patterns Y and Z. The development of the film produces a negative 26 indicative of circuit patterns Y and Z, since the blue light rays emanating from the blue pattern X were allowed to pass through the filter 17. This negative 26 represents the circuit patterns for one side of the circuit board.

*Step 4.*—Expose a photosensitive photographic film to light passing through the master 16, the translucent yellow circuit pattern Y, the translucent blue circuit pattern X, the translucent green circuit pattern Z, and a color filter 17 which absorbs blue and green light. The light rays impinging upon the lens 12 outline an image representative of the blue circuit pattern Y and the green circuit pattern Z.

*Step 5.*—Develop the film to produce a negative showing patterns X and Z. The development of the film produces a negative 31 indicative of circuit patterns X and Z since light rays emanating from the yellow pattern Y were allowed to pass through the filter 17. This negative 31 represents the circuit patterns for the other side of the circuit board.

*Step 6.*—Print the circuit patterns on both sides of a printed circuit board. The emulsion side 28 of the negative 26 is placed against one photosensitive surface of the circuit board 41. The film base 33, of the other negative 31 is placed against the other photosensitive surface of the circuit board 41. Light rays are projected through the negatives 26 and 31 to expose the photosensitive surfaces of the circuit board 41.

It will be noted that in this embodiment neither negative 26 or 31 is reversed. This method registers the circuit pattern Z common to both sides of the circuit board 41 as precisely as the first embodiment; however, a slight fuzziness of the edges of the circuit patterns are produced on the side of the board which was printed from the negative 31 which had the film base side 33 placed against the photosensitive surface of the board.

The two-sided printed circuit board may then be brought to completion by the illustrative series of steps mentioned in the first embodiment.

OTHER ALTERNATIVES

Another method of practicing the invention is to repeat Steps 1 to 5 of the first embodiment with a new Step 6 as follows. A reverse positive is made from the negative 26 by exposing the emulsion side 28 of the negative away from the emulsion side of a film (not shown). A correct positive is made from the negative 31 by exposing the emulsion side 32 of the negative against the emulsion side of a film (not shown).

The circuit patterns are printed onto both sides of the printed circuit board 41 with the emulsion side of the positives placed against the photosensitive surfaces of the circuit board. The positives are exposed to light and developed as in the first embodiment. The unexposed gelatinous areas are removed. The exposed areas of copper, which are representative of the circuit paths, are plated with a metal or alloy, such as solder. The hardened gelatinous surfaces are then removed as described in the first embodiment. The solder acts as a resist when the circuit board is subsequently subjected to an etchant medium to remove the undesired areas of copper. The above-described procedure may be referred to as reverse screening or printing.

An alternative to Step 1 is to use a black tape to construct the common circuit pattern Z on the master 16. If the apparatus as arranged in FIG. 1 is used, the black tape gives the same results as the translucent green tape. No light passes through the black tape to the filter 17. Therefore, the pattern Z is produced when either a blue or yellow color sensitive filter is used.

Another alternative is to use front lighting; that is, move the light source 18 in FIG. 1 from the position shown and place it to the left of the camera so that the light rays are reflected from the patterns X, Y, and Z on the master 16 back to the lens 12. The circuit patterns X, Y, and Z are constructed of either transparent, translucent, or solid colored tapes; however, the patterns are not allowed to cross over if solid colored tapes are used.

In addition to using these techniques for producing two-sided printed circuit boards, the same techniques can be employed in constructing the circuit patterns for multi-layer printed circuit boards. In this instance, complementary circuits facing each other on different circuit boards are constructed in a similar manner to the front and back circuits of a two-sided printed circuit board.

It will be understood that the embodiments and alternatives described are illustrative of the principles of the invention and many others could be devised, without departing from the invention.

What is claimed is:

1. A method for photographically reproducing circuit patterns on a two-sided printed circuit board wherein the circuits on both sides are accurately aligned with respect to each other, comprising the following steps:

applying a first translucent pattern of a first color onto a translucent master in accordance with a common circuit pattern desired to be produced on both sides of the printed circuit board;

applying a second translucent pattern of a second color onto the master in accordance with a circuit pattern desired to be produced only on a first side of the printed circuit board;

applying a third translucent pattern of a third color onto the master in accordance with a circuit pattern desired to be produced only on the second side of the printed circuit board;

exposing a first photosensitive photographic film to light passing through the master, the patterns, and a first color filter which precludes light of the first and third colors;

developing the first film to produce a first negative having an image representative of the first and third patterns desired for the second side of the printed circuit board;

exposing a second photosensitive photographic film to light passing through the master, the patterns, and a second color filter which precludes light of the first and second colors;

developing the second film to produce a second negative having an image representative of the first and second patterns desired for the first side of the printed circuit board;

placing the first and second negatives in alignment on opposite sides of a board which have metal surface layers covered by a photosensitive emulsion;

exposing the emulsion coated sides of the board to light passing through the respective first and second negatives; and developing and etching the exposed board to produce a two-sided printed circuit board.

2. A method of producing a two-sided printed circuit board having circuits on opposite sides of the board which are in alignment, comprising the following steps:

applying a first tape of a translucent green color onto a translucent master in accordance with a common circuit pattern desired to be produced in alignment on both sides of the printed circuit board;

applying a second tape of a translucent blue color onto the master in accordance with a circuit pattern desired to be produced only on a first side of the printed circuit board;

applying a third tape of a translucent yellow color onto the master in accordance with a circuit pattern desired to be produced only on the second side of the printed circuit board;

exposing a first black and white photographic film to light passing through the master, the tapes, and a first filter which precludes green and yellow light;

developing the first film to produce a first negative having an image representative of the circuit pattern formed by the green and yellow tapes;

exposing a second black and white photographic film to light passing through the master, the tapes, and a second filter which precludes blue and green light;

developing the second film to produce a second negative having an image representative of the circuit pattern formed by the green and the blue tapes;

placing the first and second negatives in alignment on opposite sides of a board which have metal surface layers covered by a photosensitive emulsion;

exposing the emulsion coated sides of the board to light passing through the respective first and second negatives; and developing and etching the exposed board to produce a two-sided printed circuit board.

3. The method as defined in claim 1 which includes the following step:

photographically reproducing the first negative to produce a reverse negative depicting the total circuit pattern in a developed emulsion which is on the opposite side of the reverse negative with respect to the emulsion side on the first negative; and in which the second and the reverse negatives are placed in alignment on opposite sides of the board prior to exposing, developing, and etching the board.

4. A method of producing circuits on opposite sides of a printed circuit board which comprises:

laying a first light transmitting pattern of a first color onto a light transmitting master in accordance with a circuit desired to be produced on a first side of the printed circuit board;

laying a second light transmitting pattern of a second color onto the light transmitting master in accordance with a circuit desired to be produced on the second side of the printed circuit board;

projecting polychromatic light through the master and the patterns;

placing a first filter which precludes light of the second color in the path of the light projected through the master and the patterns;

exposing a first photosensitive film to the light projected through the master, the patterns, and the first filter;

developing the first film to produce a first negative depicting the second pattern;

placing a second filter which precludes light of the first color in the path of the light projected through the master and the patterns;

exposing a second photosensitive film to light passing through the master, the patterns, and the second filter;

developing the second film to produce a second negative depicting the first pattern;

placing the first and second negatives in alignment on opposite sides of a board which have metal surface layers covered by a photosensitive emulsion;

exposing the emulsion coated sides of the board to light passing through the respective first and second negatives; and developing and etching the exposed board to produce a two-sided printed circuit board.

5. A method of producing circuits on opposite sides of a printed circuit board as defined in claim 4 which includes the following step of:

photographically reproducing the first negative to produce a reverse negative depicting the second pattern in a developed emulsion which is on the opposite side of reverse negative with respect to the emulsion side on the first negative; and wherein the second and the reverse negatives are placed in alignment on opposite sides of a board prior to exposing, developing, and etching the board.

(References on following page)

References Cited by the Examiner

UNITED STATES PATENTS

| | | | |
|---|---|---|---|
| 2,942,973 | 6/1960 | Patrick | 96—35 |
| 2,971,841 | 2/1961 | Moore | 96—30 |
| 3,156,563 | 11/1964 | Harrison et al. | 96—36 |

FOREIGN PATENTS

| | | |
|---|---|---|
| 867,559 | 5/1961 | Great Britain. |

OTHER REFERENCES

Cooke, D. E., Color By Overprinting, Phila., John C. Winston Co., 1955, pp. 6–11 relied on.

Swiggett, "Introduction to Printed Circuits," 1956, John F. Rider Publisher, Inc., N.Y., pp. 18–38.

Kodak Color Handbook, Eastman Kodak Co., 1950, pp. 3–13 and 30–43.

Eisler, "The Technology of Printed Circuits," Heywood and Co. Ltd., 1959, pp. 111–131.

Biondi, Transistor Technology, Von Nostrand, 1958, vol. III, page 152.

NORMAN G. TORCHIN, *Primary Examiner.*

A. D. RICCI, C. L. BOWERS, *Assistant Examiners.*